United States Patent [19]
Lo et al.

[11] Patent Number: 5,970,052
[45] Date of Patent: Oct. 19, 1999

[54] METHOD FOR DYNAMIC BANDWIDTH TESTING

[75] Inventors: Tin-Chee Lo, Fishkill; George A. Katopis, Poughkeepsie; Timothy Gerard McNamara, Fishkill; David Allan Webber, Poughkeepsie; Joseph L. Braun, Millbrook; Paul R. Turgeon, Woodstock, all of N.Y.

[73] Assignee: International Business Machines Corporation, Armonk, N.Y.

[21] Appl. No.: 08/933,574

[22] Filed: Sep. 19, 1997

[51] Int. Cl.[6] .................................................... G06F 11/267
[52] U.S. Cl. ........................................ 370/241; 395/200.62
[58] Field of Search ..................................... 370/241–245, 370/248, 250–252, 465, 468, 437; 395/200.6, 200.62, 200.63, 200.64, 200.67

[56] References Cited

U.S. PATENT DOCUMENTS

| | | | |
|---|---|---|---|
| 4,059,736 | 11/1977 | Perucca et al. | 200/51.09 |
| 4,633,411 | 12/1986 | Bliss et al. | 702/77 |
| 5,689,513 | 11/1997 | Okita et al. | 370/248 |
| 5,698,876 | 12/1997 | Yabe et al. | 257/296 |

*Primary Examiner*—Huy D. Vu
*Assistant Examiner*—Jasper Kwoh
*Attorney, Agent, or Firm*—Lynn L. Augspurger

[57] ABSTRACT

A method for dynamic bandwidth testing of a link between two computer subsystems useful for determining the amount of data which can be buffered in a transmission line by delay, in which at each end of the line circuit modules are provided to couple the subsystem by a bi-directional multi-bit (BiDi) link, and providing within each said circuit module a built-in circuit and logic for dynamic transmission characterization and test of a said BiDi link between computer subsystems using built-in characterization logic macros, and during a test mode, switching said said built-in circuit and logic to test mode and using the test mode to characterize the link performance, and after the completion of characterization, the switching built-in characterization logic macros back to a normal system mode after programmatically setting timing parameters for the BiDi link to ensure safe operation of data transfer before the BiDi link is switched to system mode.

13 Claims, 13 Drawing Sheets

S<0=6> ARE OUTPUT OF
SCAN-ONLY REGISTERS

METHOD FOR DYNAMIC BANDWIDTH TESTING

FIELD OF THE INVENTION

This invention relates to networked computer subsystems, including chip busses and longer links, and particularly to a method for dynamic bandwidth testing of bi-directional transmission links between computer subsystems using built-in characterization logic.

BACKGROUND OF THE INVENTION

When two computer subsystems are connected by a bi-directional multi-bit transmission links bus (BiDi) linking two chips on a module or linking two modules within a computer system, several questions arise. They are: (1) What is the bandwidth of the link? (2) How many bits can be stored in the link during data transmission? (3) How fast one can change the BiDi direction? and (4) What is the timing/clocking relationships between two subsystems? These are not easy to answer questions.

SUMMARY OF THE INVENTION

Our invention provides a built-in circuit and logic for dynamic transmission characterization and test a BiDi between computer subsystems using built-in characterization logic. During test mode, the hardware of this invention is used to characterize the link performance. After the completion of characterization, the hardware is switched back to normal system mode. The hardware has programmable capability which involves the setting of timing parameters for the link to ensure safe operation of data transfer before the BiDi is switched to system mode. The hardware macro of this invention is placed on two chips of two linked computer subsystems. The illustrating our preferred embodiment of our invention we have assumed arbitrarily that the BiDi is 10 bit wide.

These and other improvements are set forth in the following detailed description. For a better understanding of the invention with advantages and features, refer to the description and to the drawings.

BRIEF DESCRIPTION OF THE DRAWINGS

The figures are a schematic overview of the preferred embodiment, in which.

(Note: For convenience of illustration, FIGURES may be separated in parts and as a convention we place the top of the FIGURE as the first sheet, with subsequent sheets proceeding down and across when viewing the FIGURE, in the event that multiple sheets are used.)

Our detailed description explains the preferred embodiments of our invention, together with advantages and features, by way of example with reference to the following drawings.

DETAILED DESCRIPTION OF THE INVENTION

Before considering our preferred embodiments in detail, it may be worthwhile to illustrate, by way of example, . . .

Figure 1:
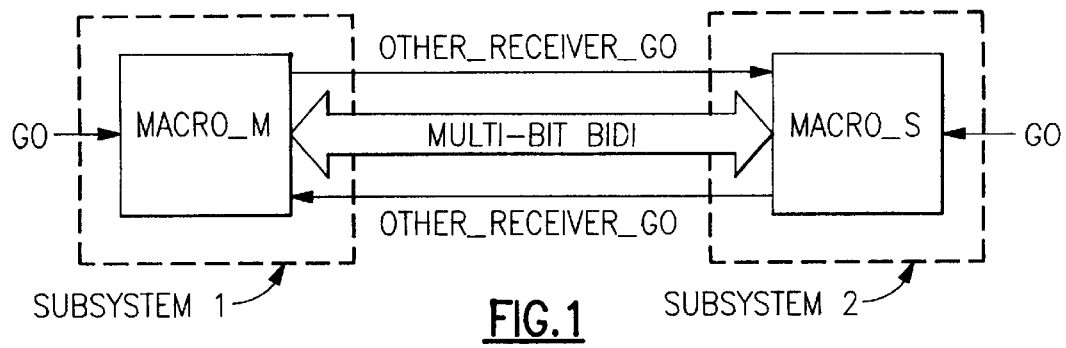
FIG. 1 shows our preferred built-in test macros linked by a BiDi whose bandwidth and data transmission parameters are to be characterized.

Turning now to our invention in greater detail, it will be seen from FIG. 1 which illustrates our preferred embodiment in which we illustrate our architecture of our bandwidth testing macro.

Architecture of the Bandwidth Testing Macro

There are two identical macros placed on two computer subsystems between which the BiDi links. Refer to FIG. 1 which shows the system configuration with subsystem 1 and subsystem 2 respectively. During characterization or testing, one macro is defined as Master (Macro_M), another macro is defined as Slave (Macro_S). They are linked by a multi-bit (e.g. 10) BiDi bus. The BiDi may take on different form. They can be metal transmission lines or optical links. Also show are two one-bit unidirectional links labelled "other_receiver_go". They serve as timing/command signals. A "go" signal (per macro) is used to initiate command execution. Detailed description will be given.

Figure 2:
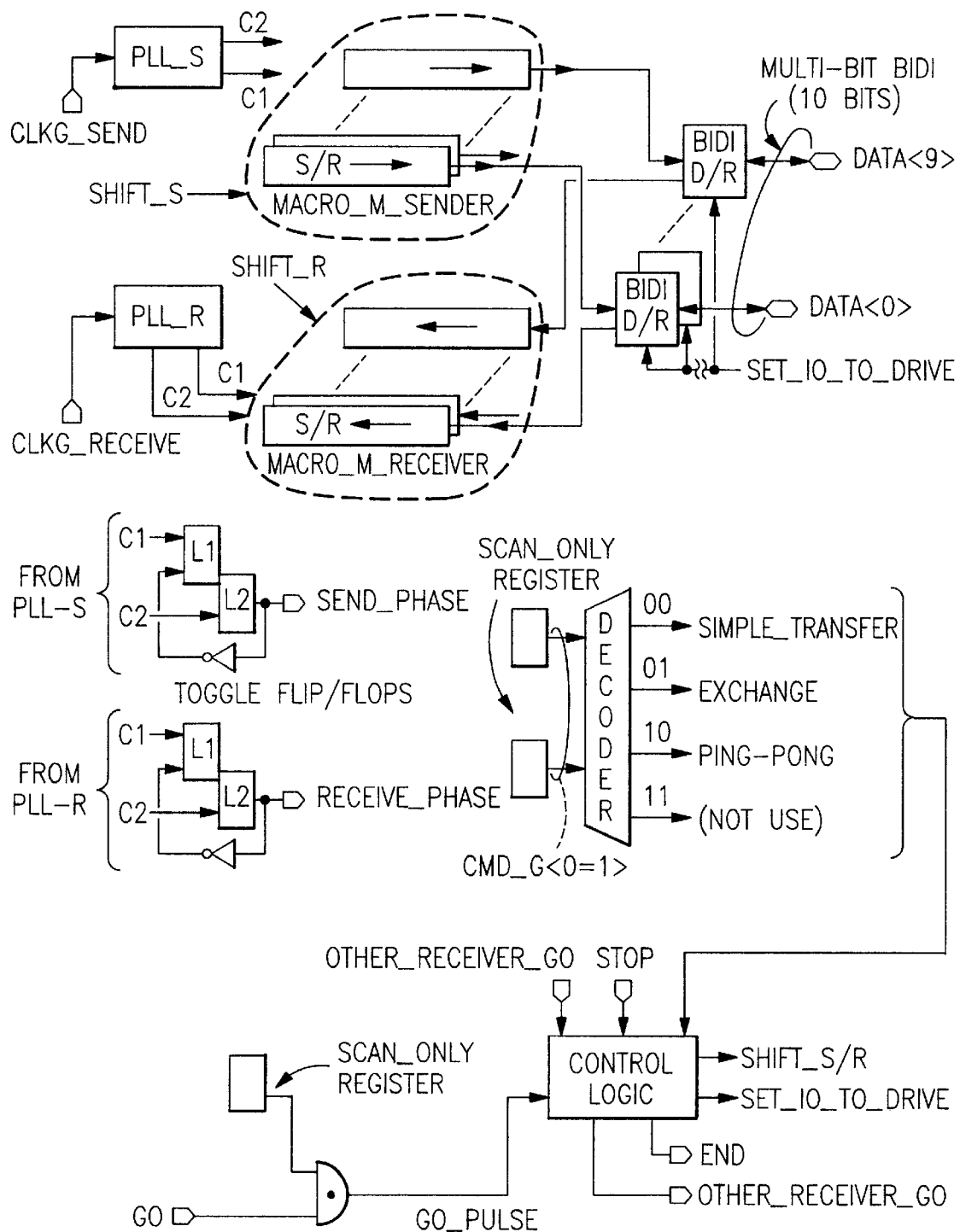
FIG. 2 shows our preferred key elements within the macro.

FIG. 2 shows the key elements within the Macro. The Macro has two sets of shift registers, one for sending and one for receiving serial data. In Macro_M (FIG. 2), we have Macro_M_Sender and Macro_M_Receiver. Likewise, in Macro_S (not shown), we have, Macro_S_Sender and Macro_S_Receiver. They are correspondingly identical. Macro_M_Sender and Macro_S_Sender are conveniently called "Sender" and Macro_M_Receiver and Macro_S_Receiver are conveniently called "Receiver". We use the Master macro (Macro_M of FIG. 2) nomenclature in most of our discussions. In the embodiment of this invention, each set of Sender or Receiver consists of 10 shift registers, and each shift register is 64 bit long. Sender shift registers are controlled by shift_s signal. Receiver shift registers are controlled by shift_r signal.

The clocking of Sender and Receiver are controlled by two Phase Lock Loop (PLL) driven clock blocks as shown in FIG. 2 In Macro_M, Macro_M_Sender is controlled by PLL_S clock block, and Macro_M_Receiver is controlled by PLL_R clock block. The PLLs that drive these two clock blocks are not shown. PLL_S receives a global reference clock from a PLL, clkg_send, and generates a pair of non-overlapping clocks C1 and C2 for the Macro_M_Sender. PLL_R receives a global reference clock from another PLL, clkg_receive, and generates a pair of non-overlapping clocks C1 and C2 for the Macro_M_Receiver. Similar arrangement is for the Macro_S of FIG. 1.

The arrival time of the clkg_receive in the Macro_S of subsystem 2 is experimentally tuned with respect to the clkg send in Macro_M of subsystem 1, so that data transfer will work properly with a particular length of the BiDi bus. Similarly, the arrival time of the clkg_receive in the Macro_M of subsystem 1 is experimentally tuned with respect to the clkg_send in Macro_S of subsystem 2, so that data transfer will work properly in either direction. It is assumed that all wires of the BiDi bus are properly tuned to ensure identical transmission characteristic.

Refer to FIG. 2. There are two one-bit toggle flip-flops. They are driven by C1/C2 clocks generated from clkg_send (PLL_S) and clkg_receive (PLL_R) respectively. The outputs of these two flip-flops, labelled send_phase and receive_phase, are used to calibrate (or observe) the phases of the two global reference clocks.

In addition, Macro_M sends a 1 bit unidirectional command bus to Macro_S in a like manner as does the BiDi bus. Similarly, Macro_S also has a 1 bit command sent to Macro_M. The roles of master and slave are interchangeable due to the symmetry of FIG. 1. These lines are called "other_receiver_go" signals and they are electrically identical to the data BiDi links. This one bit command serves as a timing signal which activates the Receiver to shift in the receiving subsystem in conjunction with the Sender of the sending subsystem.

Each macro has an input called "go" as shown in FIG. 1. In FIG. 2, the macro which receives the "go pulse" is defined as Master. The one does not receive the "go pulse" is the Slave. The "go_pulse" is a gated version of "go" gated by a scan-only register as shown in FIG. 2. This scan-only bit determines the role (Master or Slave) of the macro. For the Master, this scan-only register is scanned in with a logic ONE. For the Slave, this scan-only register is scanned in with a logic ZERO. The "go_pulse" is used by the control logic to execute commands mentioned later. This arrangement allows the "go" signals of Macro_S and Macro_M to be common if subsystem 1 and subsystem 2 are adjacent. In actual implementation, the off-chip "go" signal may pipe down a train of latches in order to clean up its waveform before it reaches the AND gate of FIG. 2, giving rise to a snappy "go_pulse" for the control logic to use.

FIG. 2 shows 10 BiDi Driver/Receivers (BiDi D/R) which connect among the Macro_M_Sender, Macro_M_Receiver, and the BiDi bus known as data <0:9>. The role of "BiDi D/R" is controlled by a "set_io_to_drive" signal generated by the control logic.

Each macro has a 2-bit command register, cmd_q <0:1>, as shown in FIG. 2. They are scan-only register bits. Both macros (Macro_M and Macro_S of FIG. 1) will be scanned in with identical content. Their control logics will look at these 2 command bits and determine what the global function should be.

The contents of two Senders, the one in Macro_M_Sender of subsystem 1 and the one in Macro_S_Sender of subsystem 2 are loaded with test patterns at the beginning of any operation by conventional scanning mechanism.

The cmd_q registers for both the Master and the Slave macros are scanned in with the same values. These two bits determine how the pre-loaded data in the Senders are transferred:

| cmd_q(0:1) | Global Functions |
|---|---|
| 00 | Simple Transfer: |
| | Macro_M_Sender sends data to Macro_S_Receiver. When task is completed, END signal is generated by the Master. |
| 01 | Exchange: |
| | Macro_M_Sender sends data to Macro_S_Receiver. After a programmable delay (a choice of 0 to 6 cycles, known as "BiDi turn-around time"), Macro_S_Sender sends data to Macro_M_Receiver. When task is completed, END signal is generated by the Master. |
| 10 | Ping-Pong: |
| | Same as code "01" except that the "exchange" steps repeat endlessly until a STOP pulse, applied to either Master or Slave, is raised. In that event, the End signal will be generated as long as the current packet of data is completely transferred. If the last packet of data is sent by the Slave, the Slave will raise the END signal. If the last packet of data is sent by the Master, the Master will raise the END signal. |
| 11 | (not implemented) |

Figure 3:
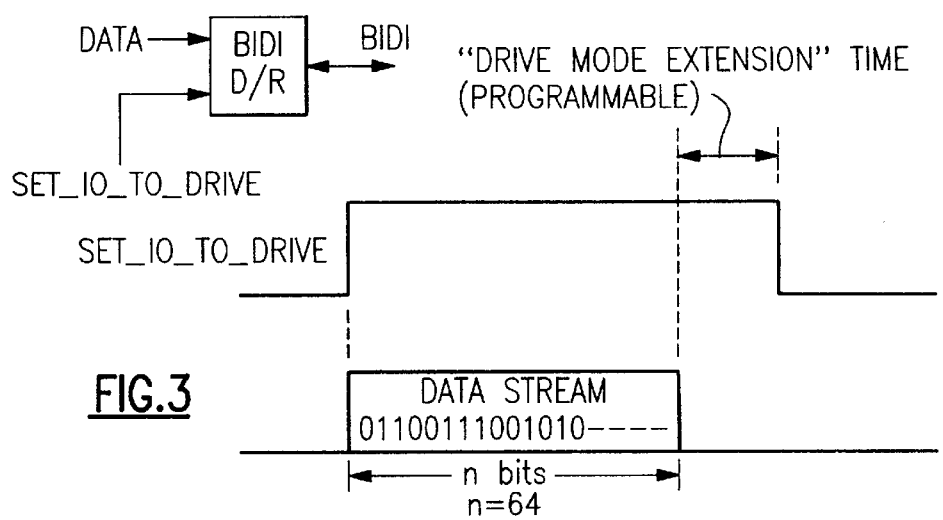
FIG. 3 shows our preferred driver mode extension timing.

The BiDi Driver/Receiver is controlled by a set_io_drive signal. When this signal is ONE, the (BiDi D/R) is in driver mode, otherwise, it is in receiver mode. After the data has left the Sender Register, the BiDi buffers must still be maintained in "driver mode" for a period of time known as "driver mode extension time" because the data has not yet arrived at the receiving macro. The timing diagram is shown in FIG. 3. How long the data takes to arrive at the receiving end depends on the length of the BiDi bus. The "driver mode extension" time is programmable, ranging from 0 to 6 cycles, offering 7 choices in our embodiment.

Dataflow

Since the BiDi is assumed to be 10 bit wide, the dataflow of Macro_M or Macro_S consists of 10 identical bit-slices.

Only one bit-slice is described. Control logic is shared by these 10 bit-slices. We need to focus on the dataflow of just one bit-slice.

Figure 4A:
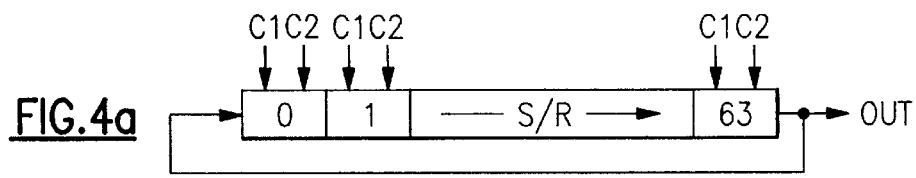
FIG. 4 shows our preferred 64 bit shift register element for sender logical view (a) and time-multiplex double speed implementation (b).

The key dataflow element of the macro is a 64 bit register whose content can be pre-set by scanning into it the users' data patterns. The logical view of the 64 bit shift register for Macro_M_Sender is shown in FIG. 4a. Each bit is clocked by C1/C2 non-overlapping pulses generated from a PLL driven clock block. The output of the shift register of the Sender feeds its input, forming a re-circulating loop as shown in FIG. 4. The outputs of the Receiver's shift registers (not shown) are dangling. This is the main difference between the Sender shift register and the Receiver shift register.

Figure 4B:
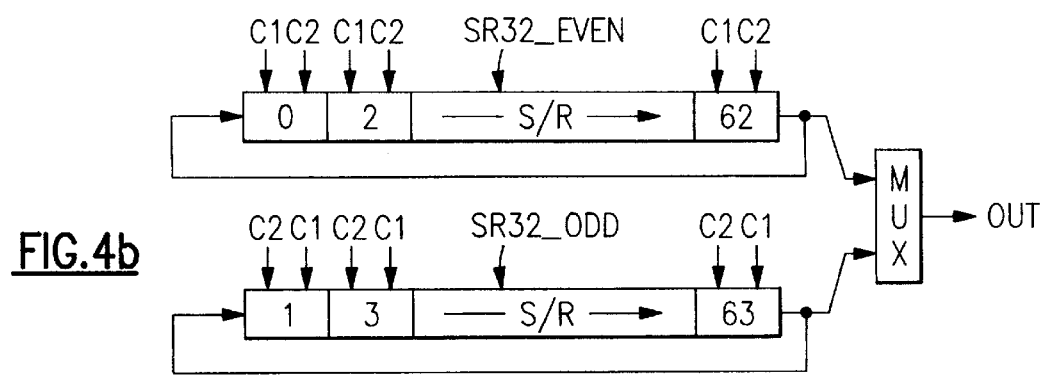

This 64 bit shift register (for both Sender or Receiver) is implemented in two 32-bit registers (SR32_even and SR32_odd of FIG. 4b). They are operated in parallel but time-offset by half of a bit-time (a pair of C1 and C2 is called a bit time) and hence they together operate in a double speed time-multiplexing fashion.

More specifically, SR32_even is clocked by the following clock sequence:

(C1/C2, C1/C2, . . . , C1/C2), whereas SR32_odd is clocked by a complementary sequence:

(C2/C1, C2/C1, . . . , C2/C1).

Figure 5:
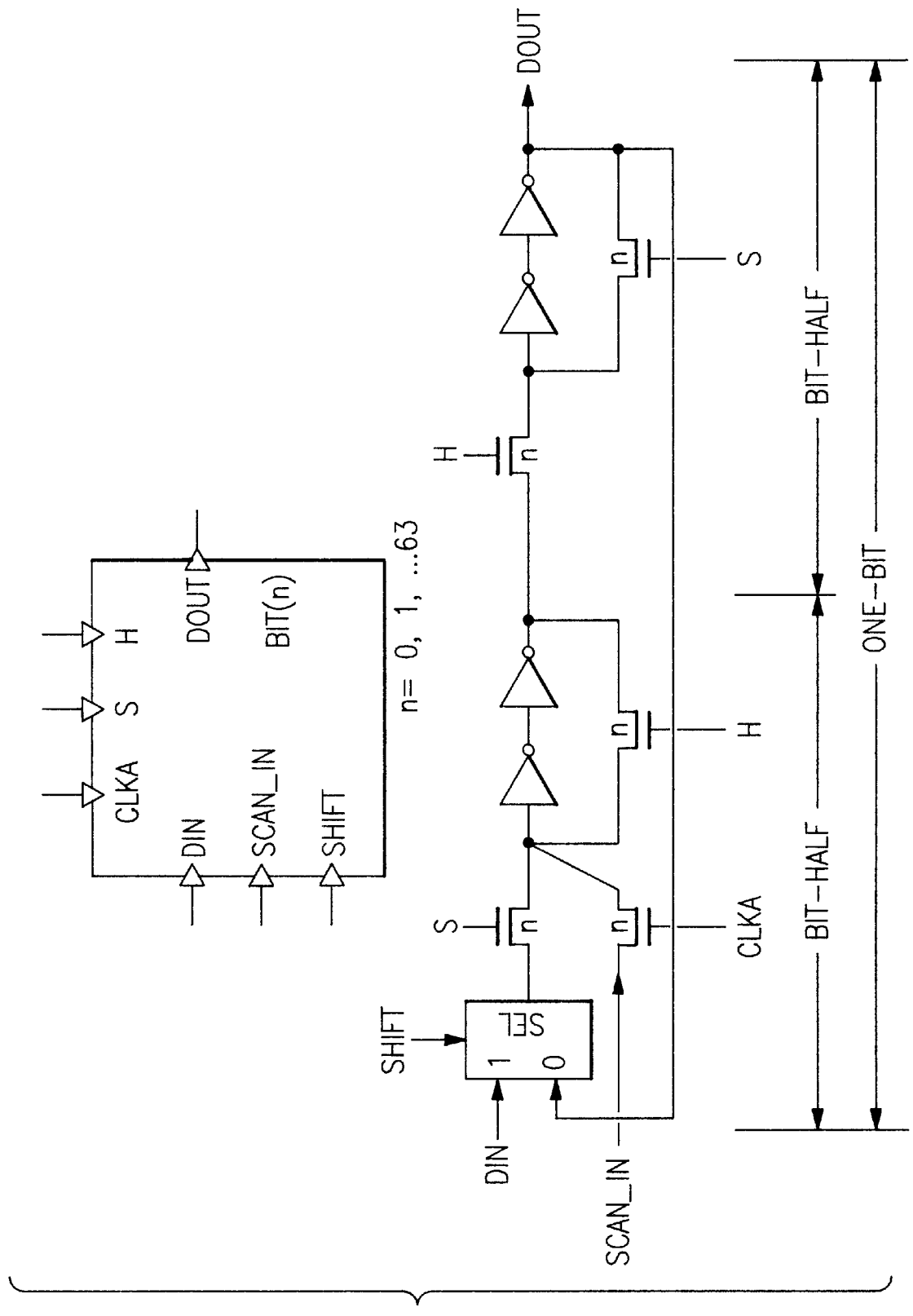
FIG. 5 shows a preferred detailed structure of one shift-register bit.

The details of each bit in FIG. 4 is shown in FIG. 5. Each bit has 3 inputs: system data (din), scan data (scan_in), and shift control (shift). Each bit has one output (dout). Each bit receives 3 clock signals: the sample clock (S), the hold clock (H), and the scan clock (clka). The detailed circuit implementation consists of two "bit-halves". The left half is a latch for sampling data or receiving scan data. The right half is for holding system data or scan data captured by the left half. The first part has a selector SEL which is controlled by signal "shift". When "shift" is ONE, system data is sampled and latched. When "shift" is ZERO, the shift-register bit re-cycles (or keeps) its content. Although the pass-gates are shown as a single NMOS device (denoted by N) for clarity, they are each a pair of devices (one NMOS and one PMOS connected in parallel) in actual implementation. If the NMOS is gated by S, for example, its PMOS counterpart (not shown) is gated by S_bar, the complementary of S. During non-scan mode, clka is set at ZERO and S and H are pulsed alternately. During scan mode, S is set at ZERO and clka and H are pulsed alternately.

Figure 6:
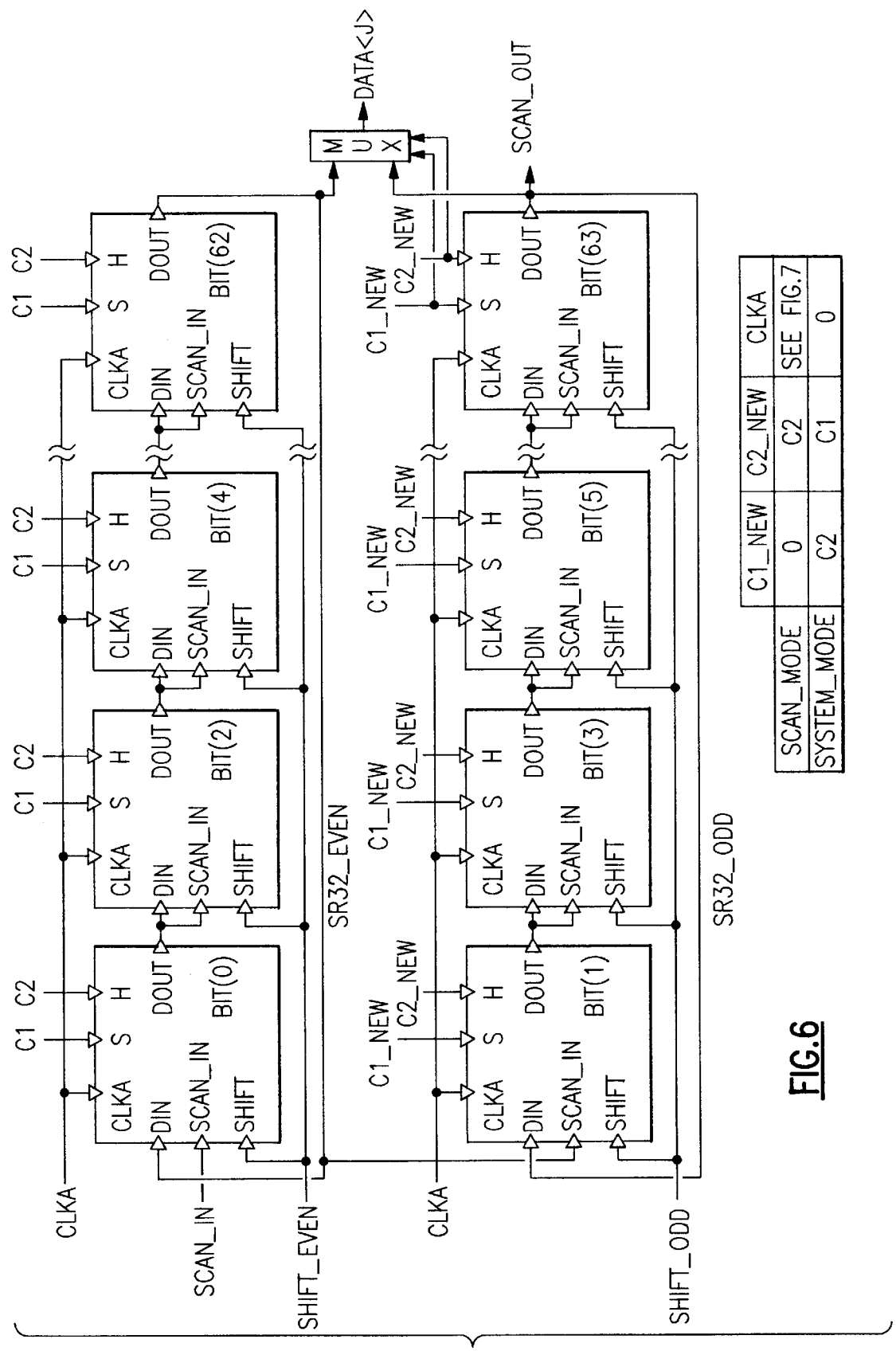
FIG. 6 shows our preferred time multiplex shift register structure showing scan-ring and clocking details.

FIG. 4b is further detailed in FIG. 6 in which the scan-ring (path from scan_in to scan_out) is also shown. The logical "shift" signal has two copies: shift_even and shift_odd. They are generated from the control logic yet to be discussed. They are logically the same but slightly different in timing. SR32_EVEN is clocked by C1 and C2, and SR32_ODD is clocked by C1_new and C2_new. From system operation point of view, C1_new is C2 and C2_new is C1 as simplified in FIG. 4b. During scan-mode operation, the two shift registers are no longer operate in parallel but in series. Therefore, SR32_ODD must be clocked in the same way as SR32_EVEN. The Truth Table of C1_new and C2_new is shown in FIG. 6. Note that FIG. 6 is for Sender shift register. Receiver shift register is identical with the exception that re-cycle loops are not present.

Examine the outputs of the shift register pair shown in FIG. 6. One bit of data is shifted out at C2 from SR32_EVEN and the subsequent data bit is shifted out at C1 (C2_new equals C1 in system mode) from SR32_ODD, resulting in two bits shifted per cycle. Same argument applies to the input end: During C1 time, a bit is shifted into SR32_EVEN, and during C2 time (C1_new equals C2 in system mode) a bit is shifted into SR32_ODD. It is clear now that one bit of data is shifted in or out when either C1 or C2 is clocked, resulting in doubling of the data transfer rate as compared to a conventional shift register scheme in which data is inputted only at C1 and outputted only at C2.

Figure 7:
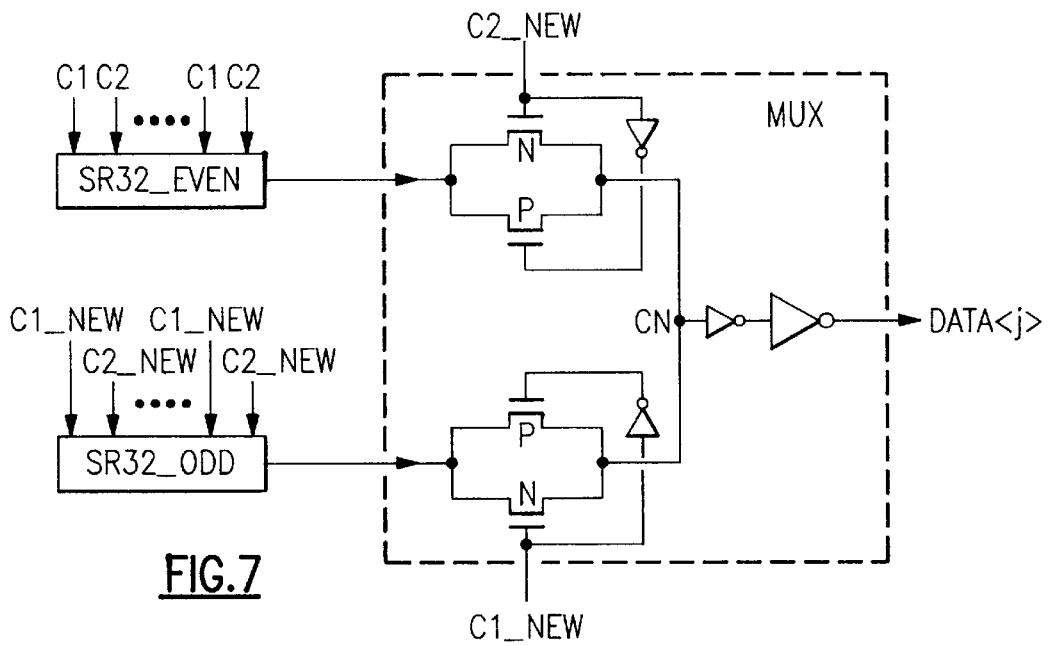
FIG. 7 shows our preferred output multiplexer for even/odd registers.

The two shift register halves are joined together at their outputs by a multiplexer (MUX). Detail circuitry for the MUX is shown in FIG. 7 in which a pair of passgates are shown. The purpose of the passgates is to ensure the common node (CN) always has valid data, either from SR32_EVEN or SR32_ODD. CN will remember the last data until it is replaced by the new data. Thus, CN will not be in undetermined states which may cause noise to the BiDi drivers.

Figure 8:
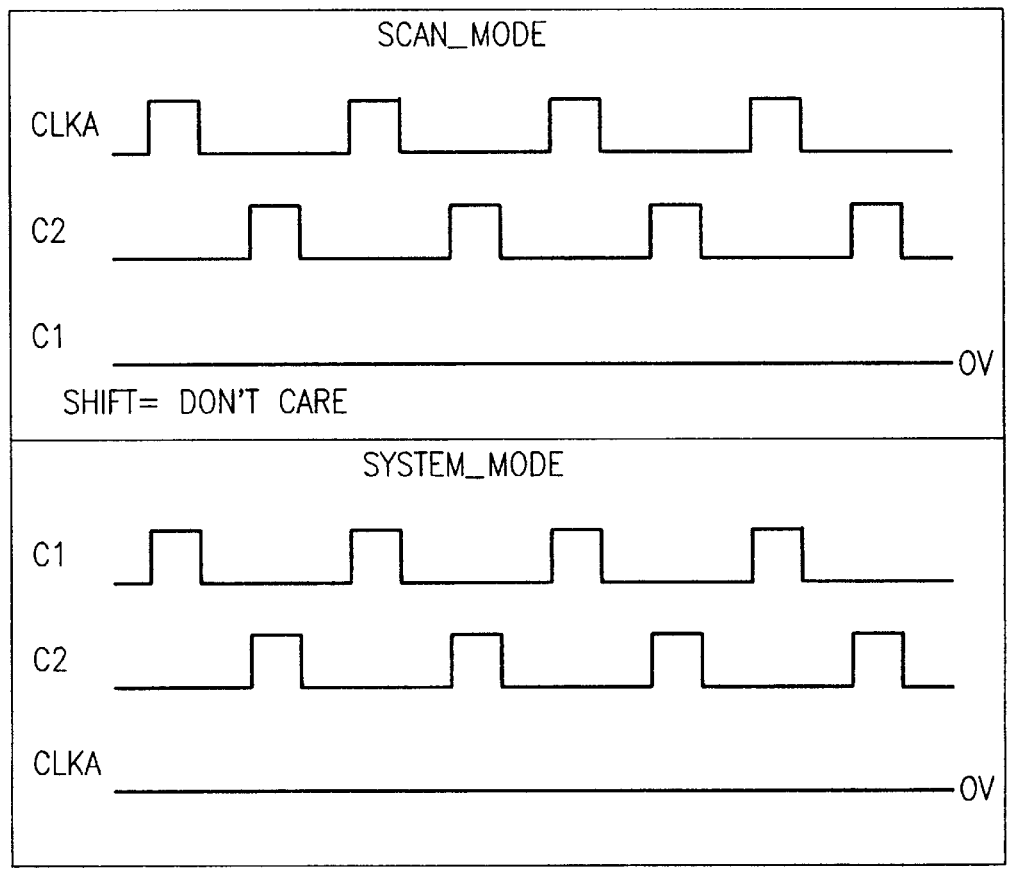
FIG. 8 shows our preferred timing diagrams for scan-mode and system-mode.

Although the C1 and C2 are required to be connected in complementary way for SR32_EVEN and SR32_ODD during operation, they should be connected identically with respect to clka and C2 clocks during scan mode because they are chained together in series. Scan mode is used to load data pattern into the shift registers prior to functional operations. During scan mode, the "shift" signal is "Don't Care" and C1 is idling at ZERO. The timing diagram of this two modes of operations are shown in FIG. 8.

Figure 9:
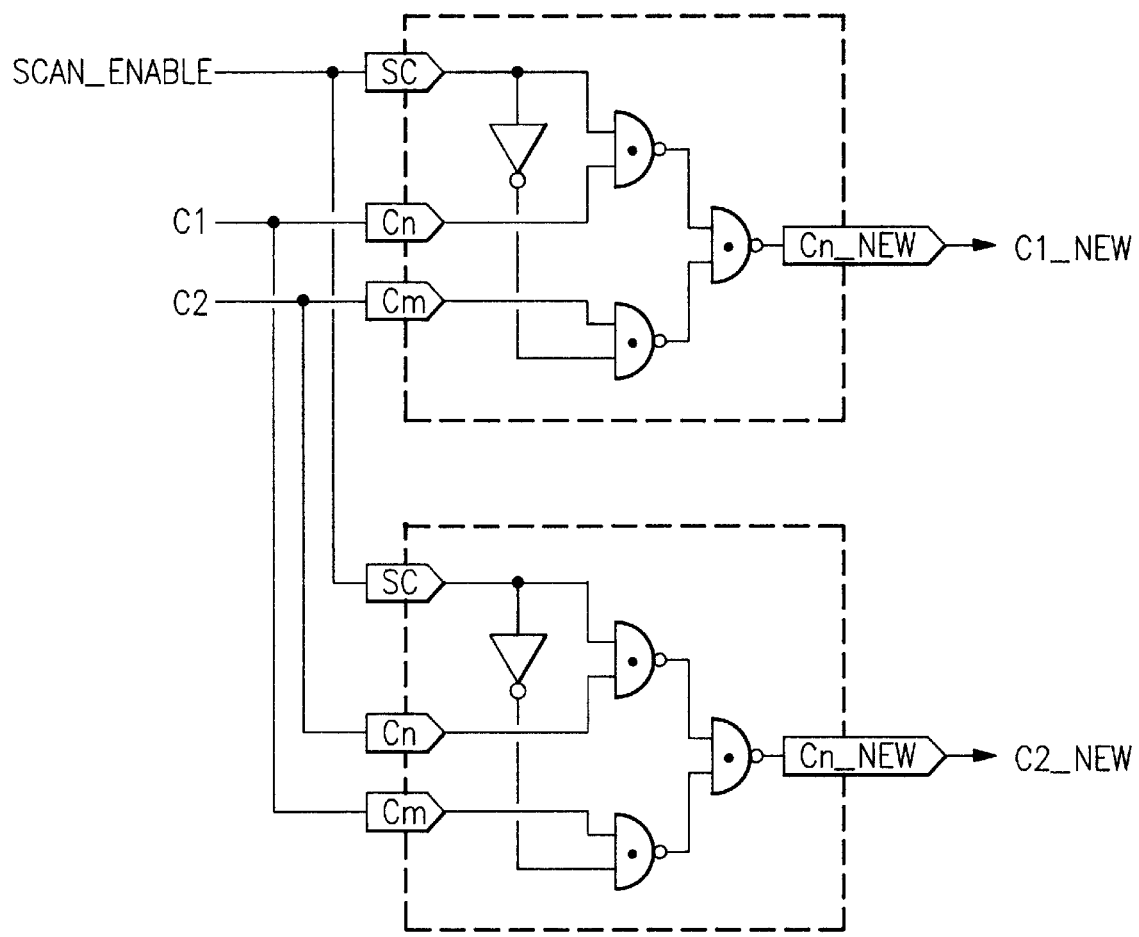
FIG. 9 shows the C1_NEW and C2_NEW pulse generation.

The alteration of clock line connections (according to Truth Table of FIG. 6) within the shift registers is controlled by a DC signal called SCAN_ENABLE inputted to the control logic of FIG. 9 whose logic effect is defined below:

| | |
|---|---|
| SCAN_ENABLE = 0 | C1/C2 for SR32_EVEN and C2/C1 for SR32_ODD as has been described above. |
| SCAN_ENABLE = 1 | clka/C2 for both SR32_EVEN and SR32_ODD who are connected indentically but in series. C1 is low. |

In each macro, there are two 64 bit time-multiplexing registers per bit-slice. For example, in Macro_M, there are a 64 bit "Macro_M_Sender" responsible for sending serial data, and a 64 bit "Macro_M_Receiver" responsible for receiving serial data (FIG. 2). Similarly in Macro_S, there are "Macro_S_Sender" and "Macro_S_Receiver" respectively. Each shift register in the Sender of a macro and each shift register in the Receiver of the same macro are connected to a BiDi Buffer (BiDi D/R) which in turn connects to a single BiDi wire to form one bit slice.

The input of the macro's Sender shift register (Macro_M_Sender of FIG. 2) is fed by its own output for recycling its own data during the send operation as shown in FIG. 4b and FIG. 6. The input of the macro's Receiver shift register (Macro_M_Receiver of FIG. 2) is connected to the BiDi pad for receiving data from the sending macro. This is the only difference between the Sender and the Receiver shift registers.

Control Logic For Both Master and Slave

Figure 10:
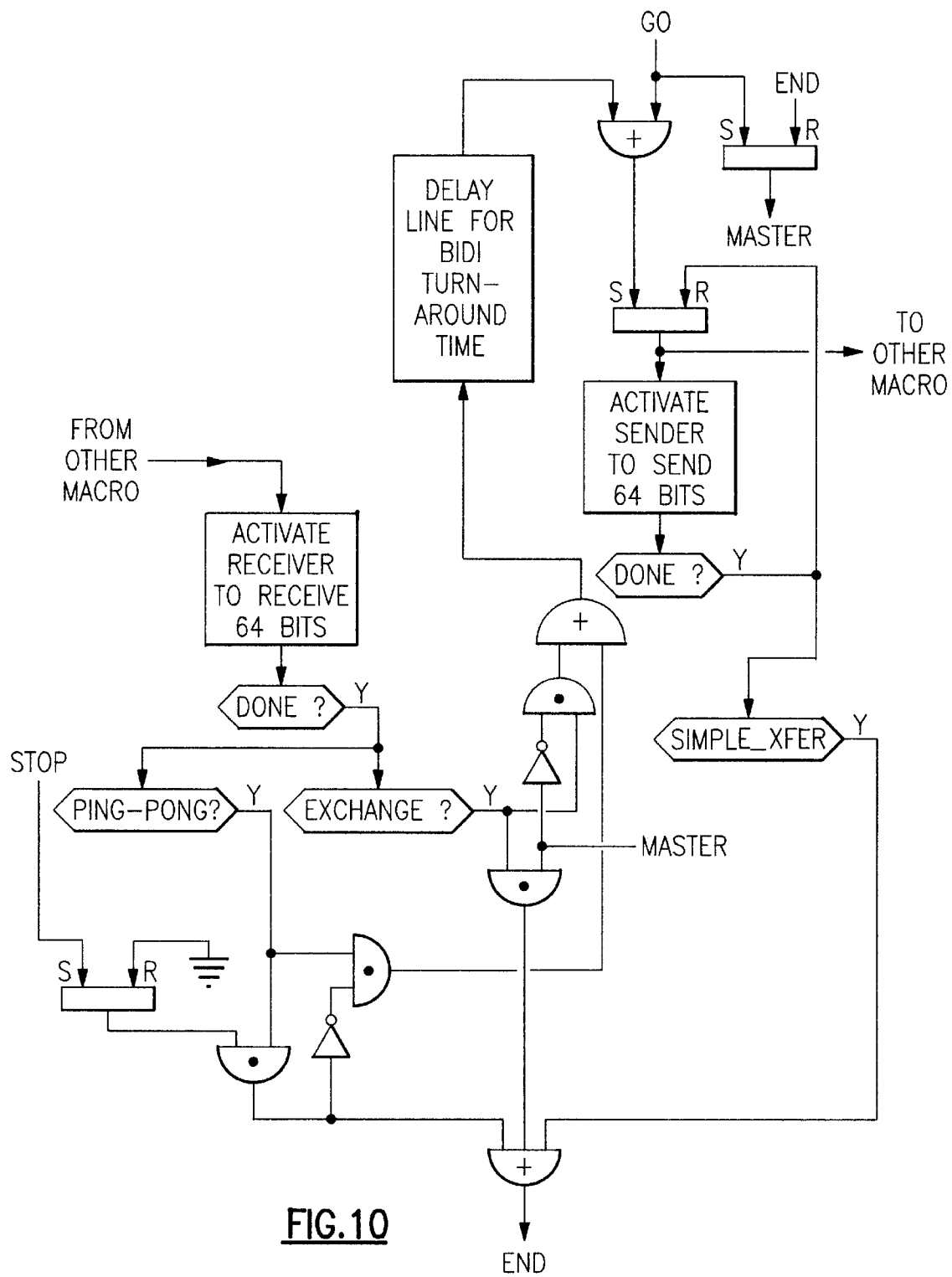
FIG. 10 shows our preferred control logic flow chart.

The concept of the control logic for both Master and Slave is shown in FIG. 10. The principle of operation of the control logic can best be described by examining the operations of each individual command.

Figure 11:
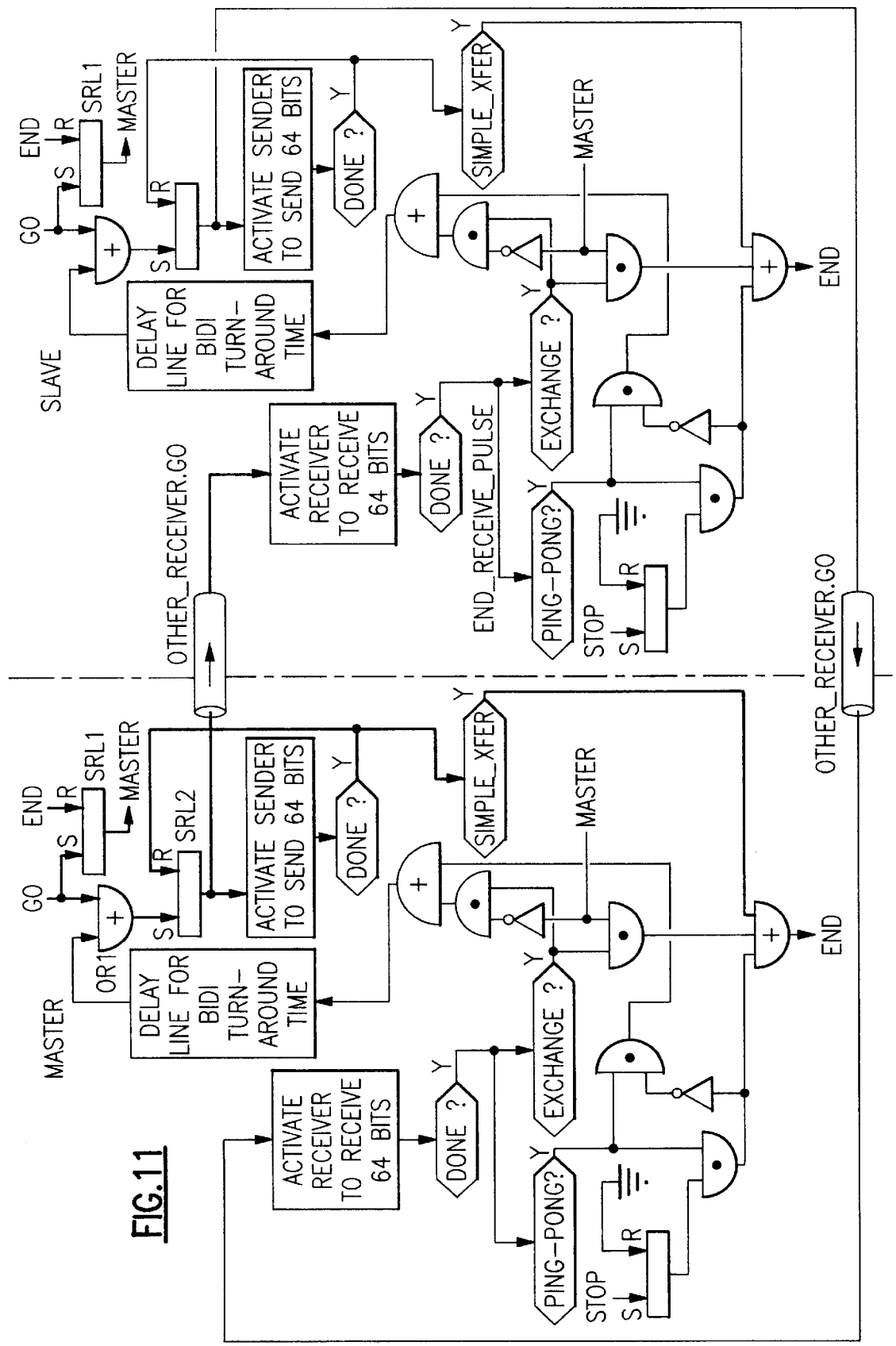
FIG. 11 shows the "simple transfer" operation.

FIG. 11 shows the operation of the "Simple Transfer". The Macro which receives the go_pulse is the Master whose SRL1 is set. The go_pulse also sets SRL2 via OR1 gate. The output of SRL2 activates the Sender of the Master. The Receiver of the Slave is also activated by the output of SRL2 but through the other_receiver_go signal which is shown in FIGS. 1 and 11.

Figure 12:
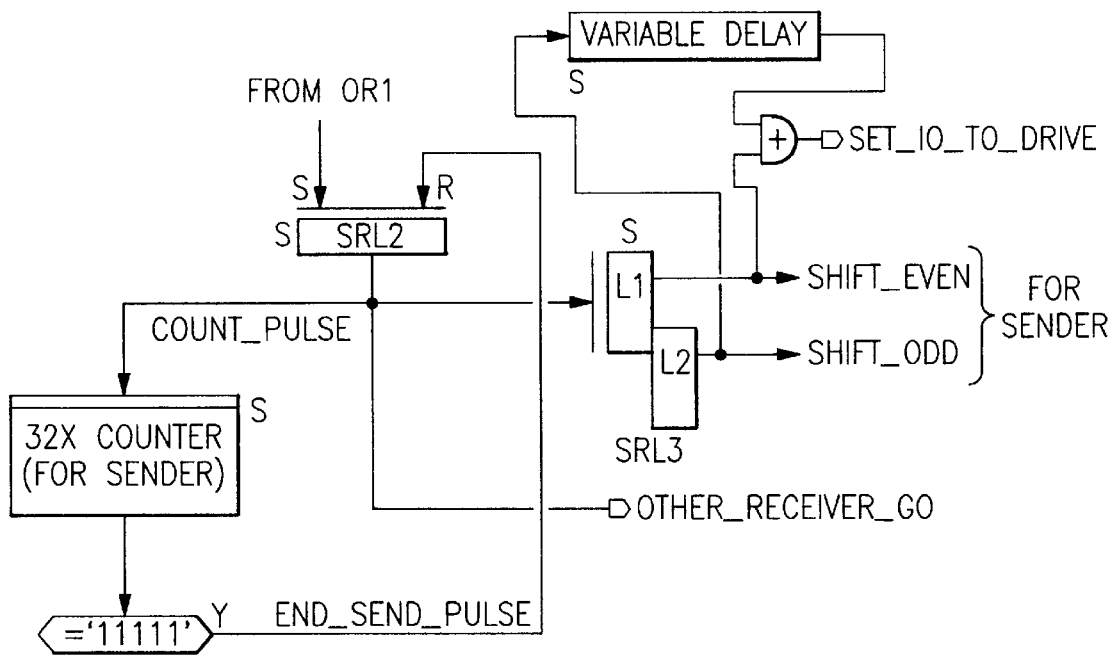
FIG. 12 shows our preferred detailed implementation of the sender control logic.

The details of the logic block called "Activate Sender to Send 64 Bits" is shown in FIG. 12 in which the output of SRL2 drives three elements:

(1) SRL3 --- The L1 output of SRL3 is "shift_even" and the L2 output is "shift_odd". They are the shift control signals for the Sender of FIG. 6.
(2) The "other_receiver_go" signal --- first appeared in FIG. 1. This signal is used as the shift control for the Receiver of Macro_S, the Macro_S_Receiver. The shift control of the Sender and the shift control of the Receiver are thus synchronized via this wire.
(3) The "32X_Counter_for_Sender" --- This is a 5 bit counter used to keep track the amount of shifts in the Macro_M_Sender of FIG. 2. It counts from 0 to 31. When the counter has counted up from "00000" to "11111", the shift register has shifted a packet of 64 bits of data in 32 cycles because of its double speed capability. A 32 cycle wide "count_pulse" which is the output of SRL2 is continually high when counter is counting. When this counter reaches "11111", and "end_send_pulse" is generated which resets SRL2 and thus stops the counter from counting and hence terminates the shift operation of the local Sender as well as the remote Receiver via the "other_receiver_go" signal.

Refer to FIG. 12. The shift_even and shift_odd signals are used to set the "BiDi D/R" of FIG. 2 in "driver mode". The shift_even signal sets the signal set_io_to_drive to logic ONE via an OR gate. The shift_odd signal extends the reset via a programmable "variable delay" line and hence creates the "driver mode extension time" of FIG. 3.

Figure 13:
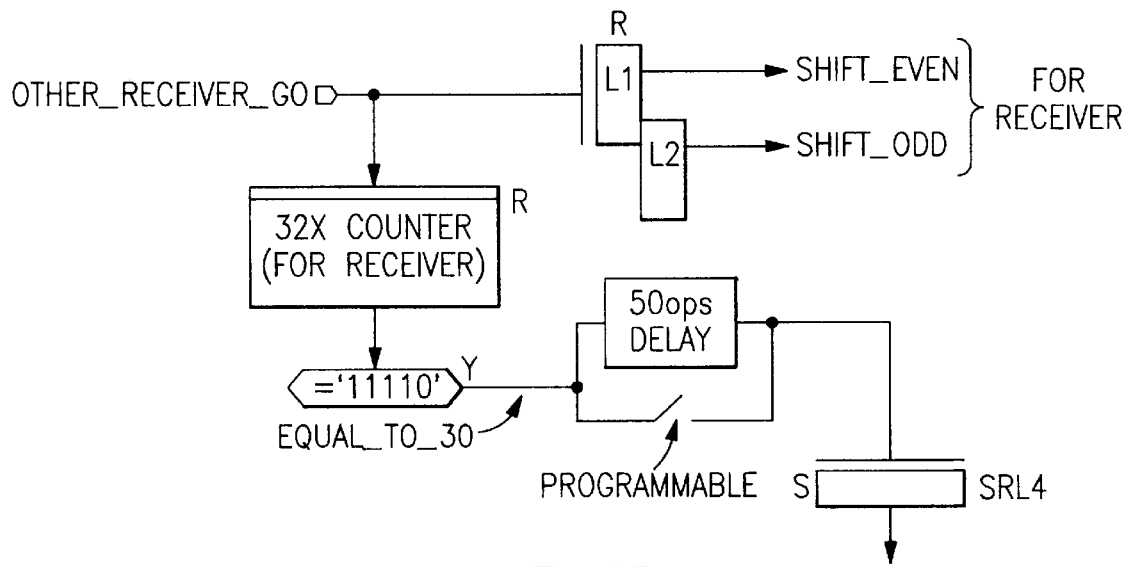
FIG. 13 shows our preferred detailed implementation of the receiver control logic.

The details of the logic block called "Activate Receiver to Receive 64 Bits" and the "Done" decision block of FIG. 11 is shown in FIG. 13. The data receiving mechanism is controlled by a 32 bit counter which is controlled by C1/C2 clocks derived from clkg receive. This counter counts from 0 to 31. But when it counts to "one less than 31", a equal-to-30 signal is generated. This signal is going through a programmable circuit delay of 500 ps and sets a staging register SRL4 which is controlled by the C1/C2 clocks derived from clkg_send. This register serves as a single point time domain transformation staging register. The output of this SRL4 which represents the full count (counting up to 31) is denoted as "end_receive_pulse". This signal is the output of the "Done" logic of FIG. 11 on the Slave side. This signal is used to activate the sender shift register which is controlled by clocks derived from clkg_send. The reason for doing this will be explained later.

Figure 14:
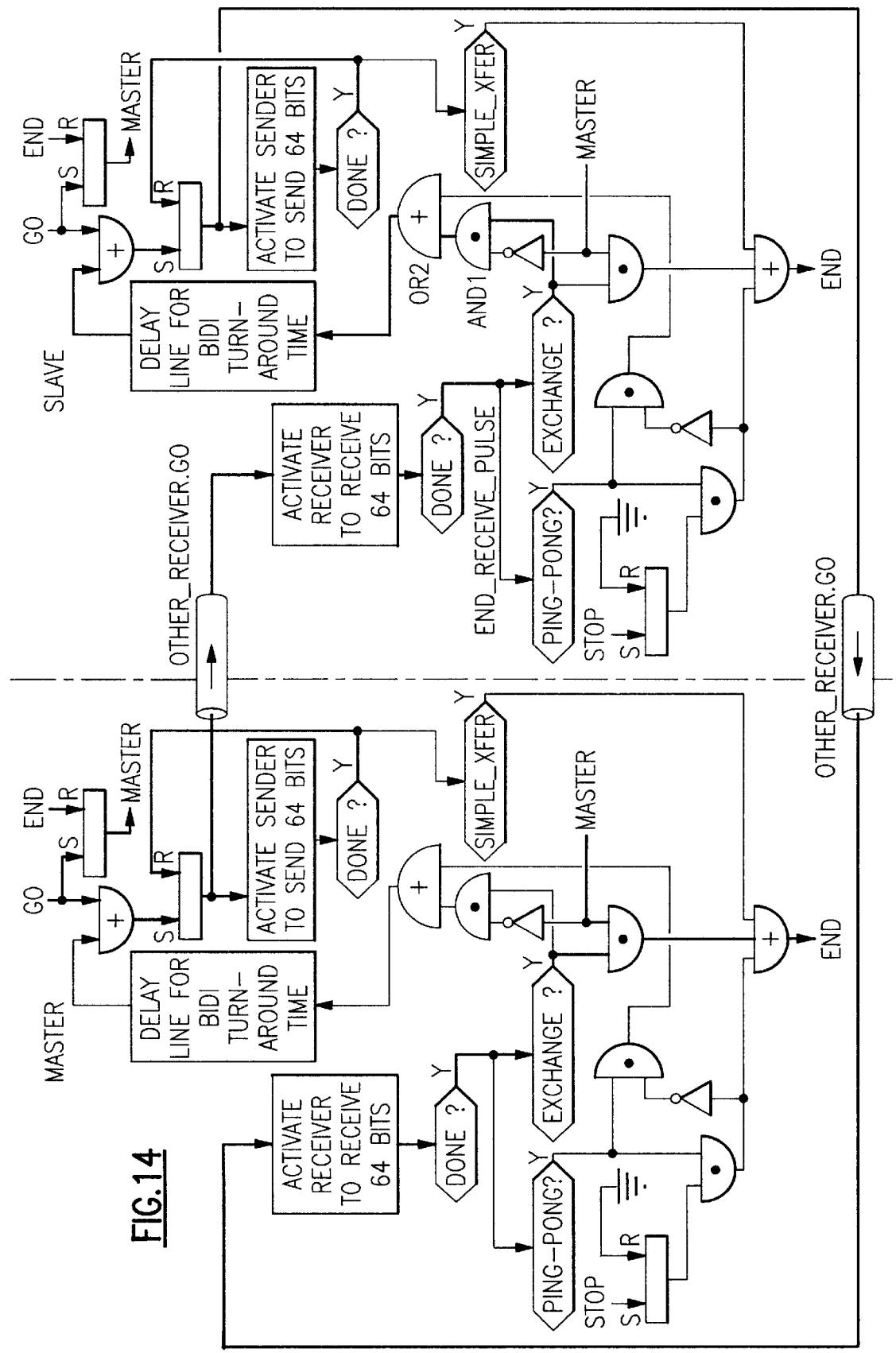
FIG. 14 shows the "exchange" operation.

FIG. 14 shows the operation of the "Exchange" command execution. After data has been received into the Macro_S_Receiver in the Slave, the "end_receive_pulse" is raised which will activate the Slave's Sender via the AND1 and OR2 gates. A BiDi turn-around time programmable delay line is inserted in the path and the Sender control logic of the Slave begins sending data from Slave's Sender into the Master's Receiver. The completion of the process is indicated by an END signal on the Master side.

Figure 15:
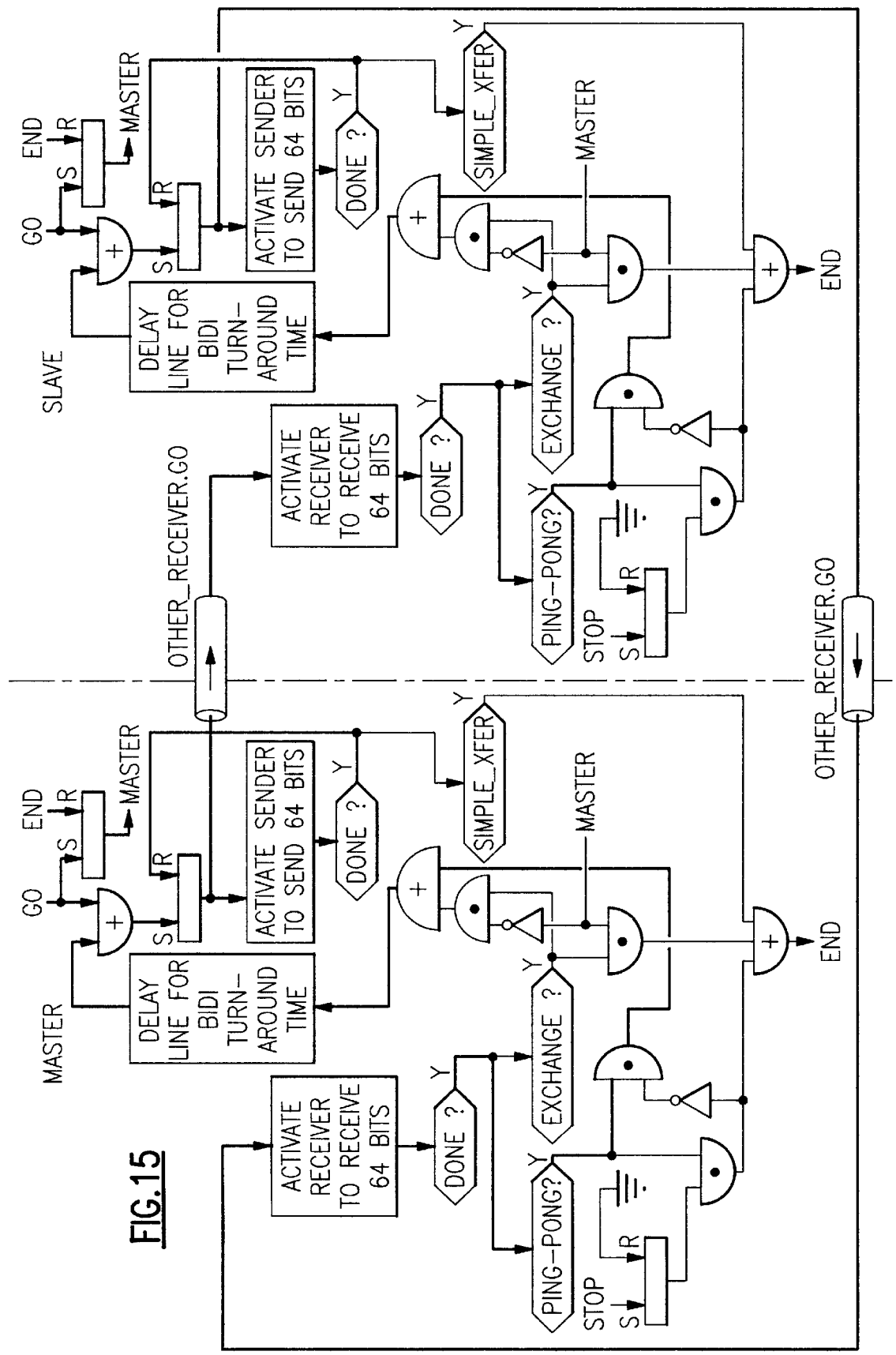
FIG. 15 shows our preferred the "ping pong" operation.
Figure 16:
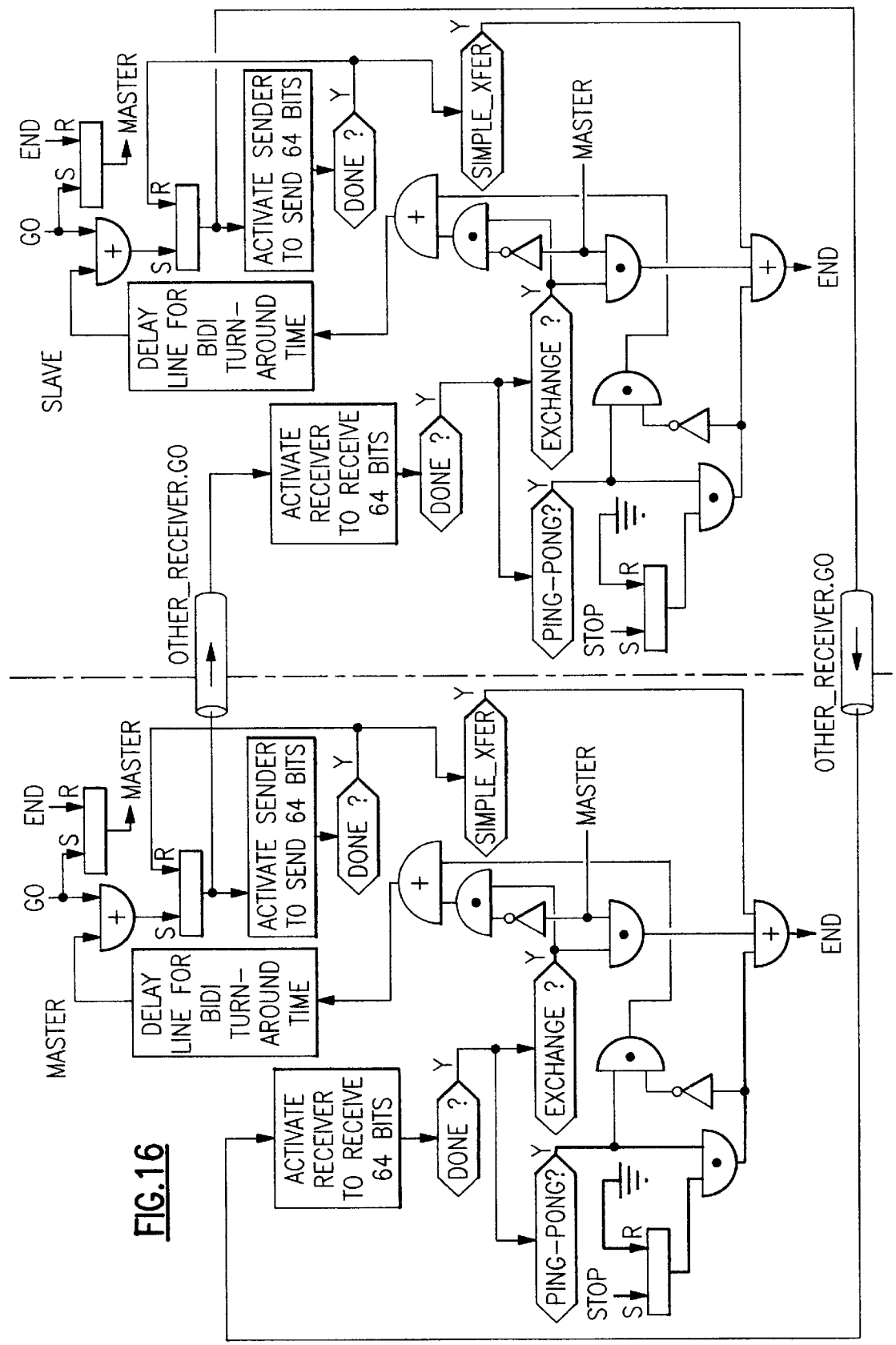
FIG. 16 shows our preferred method of stopping the ping pong operation.

The last command is "Ping Pong" which can be described by FIG. 15. Triggered by the go_pulse on the Master side, the transfer operation between the Master and the Slave take place endlessly. This repetitive oscillation will be terminated when either the Master or the Slave raise a STOP pulse. The loop breaking mechanism is shown in in FIG. 16 assuming the Master side raises the Stop signal.

As mentioned in FIG. 2, registers for sending data are controlled by clkg_send and registers for receiving data are controlled by clkg_receive. Consider the "Exchange" and "Ping-Pong" commands. For example, when the Receiver of the Macro_S has just completed the receiving of data sent from Macro_M, Macro_S will turn around the BiDi and activate its Sender to send data back to Macro_M. Now we can see the control logic is crossing from the clkg_receive domain to the clkg_send domain on the Slave side. This clock domain change is accomplished by a single register SRL4 of FIG. 13 which is controlled by clocks generated from clkg_send. This single-point domain transition is desirable because it has only one control point to tune rather than the need for worrying about many control points.

The relationship between clkg_receive and clkg_send is determined solely by the timeliness of data arrival which is a function of the BiDi length. Refer to FIG. 13. If the C1 clock (controlled by clkg_send) of the Staging Register SRL4 is late and comes after the next-cycle C2 clock (controlled by clkg_receive) of the receiving counter, the equal-to-30 signal will be missed and the macro ceases to function properly. To avoid this problem, a 500 ps delay block is programmably inserted between the equal-to-30 signal and the input of the Staging Register SRL4 to compensate for the lateness of the "equal-to-30" signal. Whether this delay insertion is needed or not is determined by the relationship between clkg_receive and clkg_send. Hence, it needs to be programmable.

Figure 17:
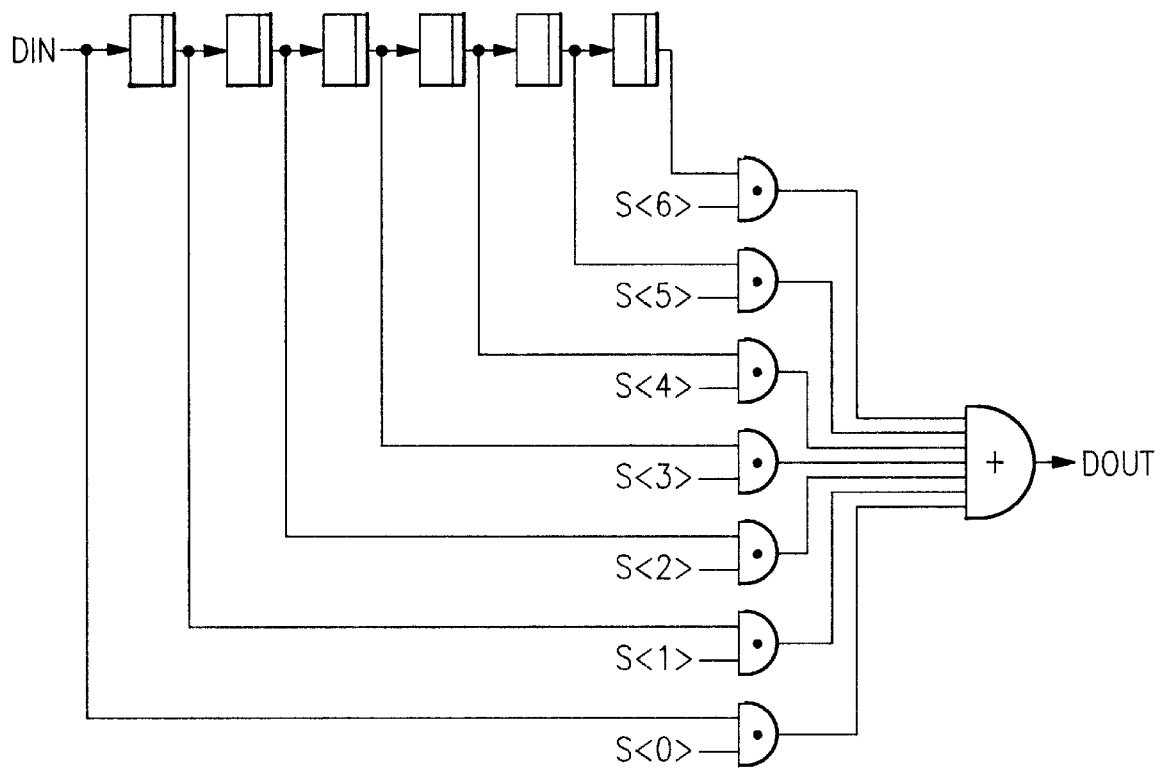
FIG. 17 shows our preferred programmable delay line.

There are two programmable delay line used in this embodiment. One is for the programming of the BiDi turn-around time (the center block of FIG. 10), another one is for the programmable driver_Mode_extension time of FIG. 3. FIG. 17 shows the logic implementation of the programmable delay line. Starting out with a ONE propagating along the 6 register chain, the ONE shoots out to the dout when one and only one of the S bit is high. The delay is determined by which bit of S <0:6> is programmed high. The S <0:6> is the output of a set of scan-only registers.

There is a bank of 18 bit Scan-Only registers used to control the operating mode of this bandwidth tester. They are:

| | |
|---|---|
| cmd_q(0:1) | 2 bit command |
| s(0:6) | 7 bit Bidi turn-around control |
| d(0:6) | 7 bit driver mode extension control |
| one_is_master | 1 bit determines who is Master |
| add_500ps_delay | 1 bit for adding delay or not |

System Integration

We have shown in this invention a Build-in Characterization Logic For Bandwidth Testing. Once the BiDi transmission Links has been fully characterized and proper variable delays have been programmed, the control logic can be electronically disengaged by inhibiting the "go_pulse". The Sender and Receiver shift registers can be properly switched in place to be data buffers to perform system operation.

While we have described our preferred embodiments of our invention, it will be understood that those skilled in the art, both now and in the future, may make make various improvements and enhancements which fall within the scope of the claims which follow. These claims should be construed to maintain the proper protection for the invention first disclosed.

What is claimed is:

1. A method for dynamic bandwidth testing of a link between two computer subsystems, comprising the steps of:
   providing circuit modules within each subsystem to couple the subsystem by a bi-directional multi-bit (BiDi) link, and
   providing within each said circuit module a built-in circuit and logic for dynamic transmission characterization and test of a said BiDi link between computer subsystems using built-in characterization logic macros, and
   during a test mode, switching said built-in circuit and logic to test mode and using the test mode to characterize the link performance, and after the completion of characterization, the switching built-in characterization logic macros back to a normal system mode after programmatically setting timing parameters for the BiDi link to ensure safe operation of data transfer before the BiDi link is switched to system mode, wherein said built-in characterization logic macros are linked by said BiDi whose bandwidth and data transmission parameters are to be characterized, and there are two macros, each of which macros have identical bit slices and a number (W) of bit slices equal to the bit width (W) of the BiDi, such that each macro has W bit slices; and wherein each macro has two sets of shift registers, one sender shift register set having W shift registers controlled by a sending signal for sending and one receiver shift register set having W shift registers controlled by a receiving signal for receiving serial data.

2. A method for dynamic bandwidth testing of a link according to claim 1 wherein said modules each have W BiDi driver/receivers (BiDi D/R) which connect said senders and receivers and the BiDi link as data controlled by a "set_io_to_drive" signal generated by control logic for said BiDi driver/receiver, a said set_io_to_drive signal is set when in a driver mode, and reset when in a receiver mode, and wherein after the data left a BiDi driver/receiver BiDi of a sending module to a BiDi receiving module then buffers in said sending module are maintained in "driver mode" for a period of time known as "driver mode extension time" because said data has not yet arrived at the receiving macro, and as said driver mode extension time is programmable.

3. A method for dynamic bandwidth testing of a link according to claim 1 wherein each shift register has 64 bit shift register elements for a logical view (a) and time-multiplex double speed implementation (b), and each 64 bit shift register's content is by scanning into it a users' data patterns with each bit of said shift register clocked by non-overlapping pulses, and wherein the output from a sending shift register of the sender feeds its input forming a re-circulating loop, while the outputs of a receiving receiver's shift registers are dangling.

4. A method for dynamic bandwidth testing of a link according to claim 3 wherein each shift register bit has inputs: system data (din), scan data (scan_in), and shift control (shift), and each shift register bit has one output (dout), each shift register bit receives three clock signals: a sample clock (S), a hold clock (H), and a scan clock (clka), and wherein the shift register circuit comprises two bit-halves, a left half being a latch for sampling data or receiving scan data and a right half for holding system data or scan data captured by the left half, and a selector which is controlled by signal "shift", whereby on one signal system data is sampled and latched, and on another signal the shift-register bit re-cycles or keeps its content.

5. A method for dynamic bandwidth testing of a link according to claim 4 wherein each shift register bit has a time multiplex shift register structure in which a scan-ring is provided and a logical "shift" signal has two copies, a shift_even and shift_odd signal copy generated from control logic which are logically the same but vary by clock timing, and wherein during scan-mode operation, the two shift registers do not operate in parallel but in series and the shift-odd copy is clocked in the same way as shift_even to increase the data transfer rate.

6. A method for dynamic bandwidth testing of a link according to claim 5 wherein each shift register bit has an output multiplexer for even/odd registers, and the two shift register halves are joined together at their outputs by a multiplexer (MUX) with a pair of passgates to ensure a common node (CN) always has valid data, either from shift_even or shift_odd, whereby the common node (CN) will remember the last data until it is replaced by the new data and the common node (CN) will not be in undetermined state.

7. A method for dynamic bandwidth testing of a link according to claim 5 wherein each shift register bit has two timing modes, one for scan-mode used to load data pattern into the shift registers prior to functional operations, and and another for system-mode.

8. A method for dynamic bandwidth testing of a link according to claim 7 wherein alteration of clock line connections within the shift registers is controlled by a DC scan enable signal inputted to control logic.

9. A method for dynamic bandwidth testing of a link according to claim 8 wherein said control logic is common for both master and slave operation.

10. A method for dynamic bandwidth testing of a link according to claim 9 wherein for a transfer operation a macro which receives a go_pulse sets a Master shift register and activates the Sender of the Master, and a Receiver of a Slave shift register is also activated by the output of the Master shift register through an other_receiver_go signal.

11. A method for dynamic bandwidth testing of a link according to claim 10 wherein triggered by the go_pulse on the Master side, the transfer operation between the Master and the Slave take place endlessly, but a repetitive oscillation will be terminated when either the Master or the Slave raise a STOP pulse.

12. A method for dynamic bandwidth testing of a link according to claim 1 wherein is provided a programmable delay line with a set high bit value propagating along a set (S) of a scan register chain to the output when one and only one shift register bit is high, and delayed by an amount by which bit of said set is programmed high.

13. A method for dynamic bandwidth testing of a link according to claim 3 wherein each shift register for both sender or receiver is implemented in two 32-bit registers which are operated in parallel but time-offset by half of a bit-time such that they together operate in a double speed time-multiplexing fashion.

* * * * *